(12) United States Patent
Chen et al.

(10) Patent No.: US 12,354,938 B2
(45) Date of Patent: Jul. 8, 2025

(54) SEMICONDUCTOR PACKAGE AND METHODS OF MANUFACTURING

(71) Applicant: Taiwan Semiconductor Manufacturing Company, Ltd., Hsinchu (TW)

(72) Inventors: Hsien-Wei Chen, Hsinchu (TW); Meng-Liang Lin, Hsinchu (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 505 days.

(21) Appl. No.: 17/662,366

(22) Filed: May 6, 2022

(65) Prior Publication Data

US 2023/0361016 A1   Nov. 9, 2023

(51) Int. Cl.
*H01L 23/49* (2006.01)
*H01L 21/48* (2006.01)
*H01L 23/00* (2006.01)
*H01L 23/367* (2006.01)
(Continued)

(52) U.S. Cl.
CPC .... *H01L 23/49838* (2013.01); *H01L 21/4853* (2013.01); *H01L 23/367* (2013.01); *H01L 23/49816* (2013.01); *H01L 23/49833* (2013.01); *H01L 23/49894* (2013.01); *H01L 25/0655* (2013.01); *H01L 24/16* (2013.01); *H01L 24/32* (2013.01); *H01L 24/73* (2013.01); *H01L 2224/16227* (2013.01); *H01L 2224/16238* (2013.01); *H01L 2224/32225* (2013.01); *H01L 2224/73204* (2013.01); *H01L 2924/1436* (2013.01); *H01L 2924/3511* (2013.01); *H01L 2924/3512* (2013.01); *H01L 2924/37001* (2013.01)

(58) Field of Classification Search
CPC ... H01L 2225/1058; H01L 2224/02371; H01L 21/4846; H01L 23/3107; H01L 2224/02372; H01L 2225/06572; H01L 23/538–5389
See application file for complete search history.

(56) References Cited

U.S. PATENT DOCUMENTS

| | | | |
|---|---|---|---|
| 9,490,198 B1* | 11/2016 | Eom | H01L 25/065 |
| 2022/0084950 A1* | 3/2022 | Noori | H01L 23/5386 |
| 2022/0189835 A1* | 6/2022 | Yim | H01L 23/5384 |

(Continued)

*Primary Examiner* — Walter H Swanson
*Assistant Examiner* — Moataz Khalifa
(74) *Attorney, Agent, or Firm* — Harrity & Harrity, LLP

(57) ABSTRACT

A semiconductor package, which may correspond to a high-performance computing package, includes an interposer over a substrate. A spacer structure is mounted to a bottom surface of the interposer. The spacer structure is configured to maintain a clearance between a bottom surface of an integrated circuit die mounted to the bottom surface of the interposer and a top surface of the substrate to reduce a likelihood of an interference or collision between the integrated circuit die and the substrate. In this way, a likelihood of damage to the integrated circuit die and/or the substrate is reduced. Additionally, a robustness of an electrical connection between the integrated circuit die and the interposer may increase to improve a reliability and/or a yield of the semiconductor package including the spacer structure.

20 Claims, 13 Drawing Sheets

(51) Int. Cl.
*H01L 23/498* (2006.01)
*H01L 25/065* (2023.01)

(56) References Cited

U.S. PATENT DOCUMENTS

2022/0399294 A1* 12/2022 Dogiamis .............. H01L 24/80
2023/0075021 A1* 3/2023 Cheng .................. H01L 23/552

* cited by examiner

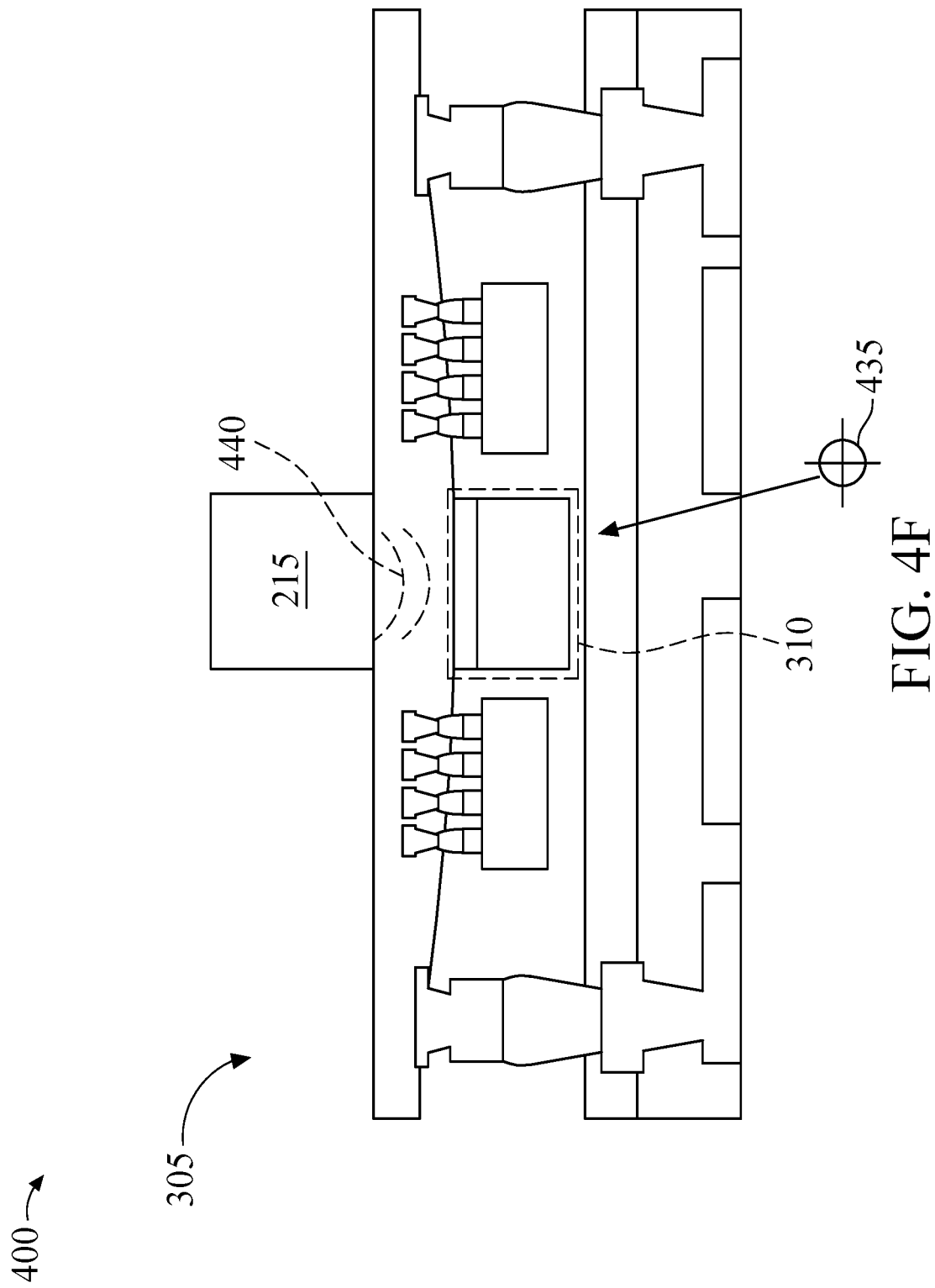

SEMICONDUCTOR PACKAGE AND METHODS OF MANUFACTURING

BACKGROUND

A high-performance computing (HPC) semiconductor package may include one or more integrated circuit (IC) dies, or chips, from a semiconductor wafer, such as a system-on-chip (SoC) IC die, a dynamic random access memory (DRAM) IC die, or a high bandwidth memory (HBM) IC die. The HPC semiconductor package may include an interposer that provides an interface between the one or more IC dies and a substrate. The HPC semiconductor package may further include one or more connection structures to provide electrical connectivity for signaling between the one or more IC dies, the interposer, and the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A-4G, and 5 are diagrams of an example implementation described herein.

DETAILED DESCRIPTION

Figure 1:
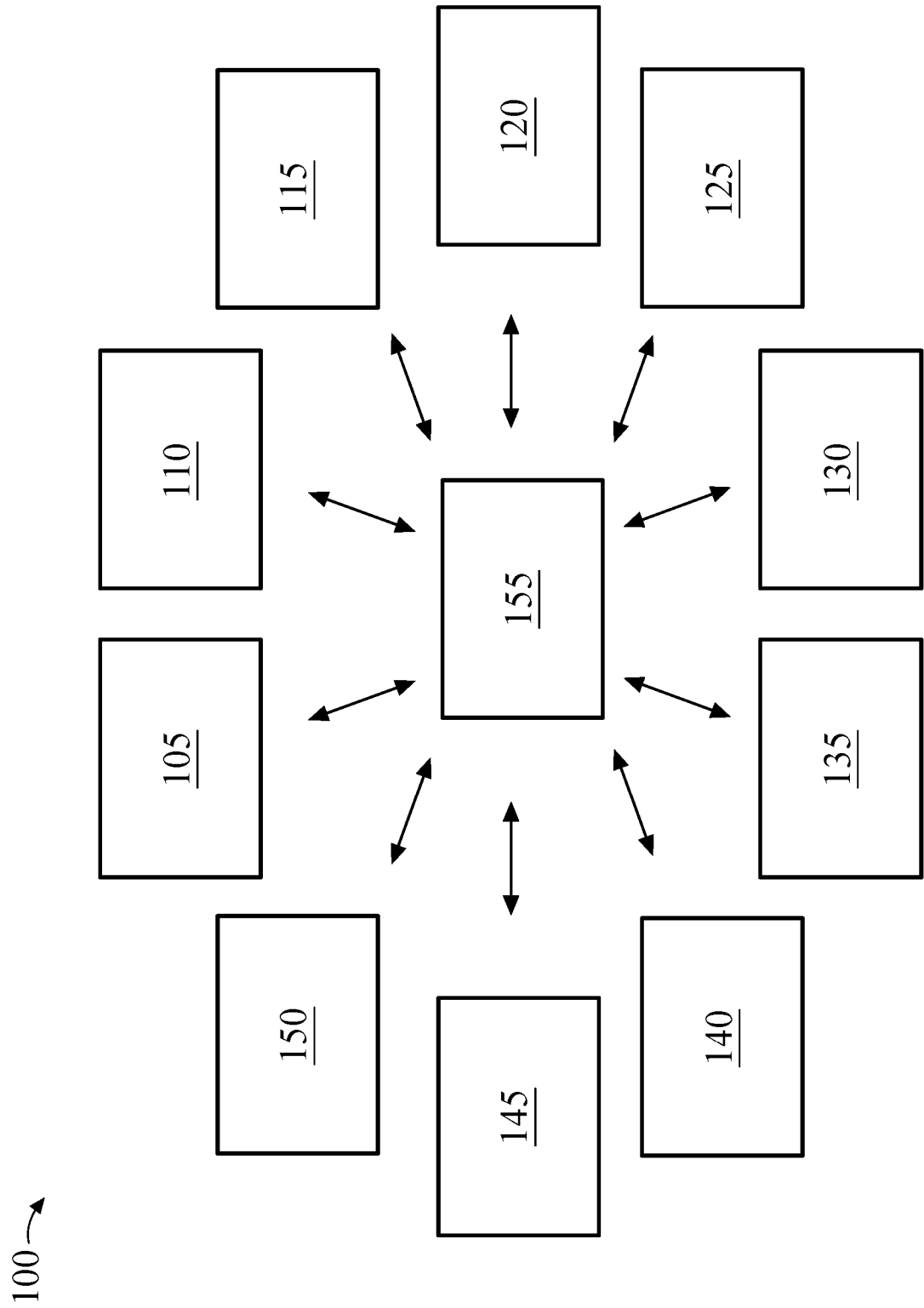
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor package may include one or more controlled collapse of chip connection (C4) standoffs (e.g., solder balls) between an interposer and a substrate. In such cases, a height of the C4 standoffs may vary or not be adequate to maintain a clearance between an IC die mounted to a bottom surface of the interposer, such as an integrated passive IC die, and a top surface of the substrate. Additionally, variances in the height across multiple C4 standoffs may cause the interposer to warp or bow above the substrate. In such a case, the IC die may interfere or collide with the substrate, causing possible damage to the IC die and/or the substrate. Additionally, the IC die may become dislodged, causing an electrical open or short with the interposer.

Some implementations herein describe a semiconductor package. The semiconductor package, which may correspond to a high-performance computing (HPC) package, includes an interposer over a substrate. A spacer structure is mounted to a bottom surface of the interposer. The spacer structure is configured to maintain a clearance between a bottom surface of an IC die mounted to the bottom surface of the interposer and a top surface of the substrate to reduce a likelihood of an interference or collision between the IC die and the substrate.

In this way, a likelihood of damage to the IC die and/or the substrate is reduced. Additionally, a robustness of an electrical connection between the IC die and the interposer may increase to improve a reliability and/or a yield of the semiconductor package including the spacer structure.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, a connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a series of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a series of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical connection access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, or a plating tool, among other examples). The RDL tool set 105 may further include a bonding/debonding tool for joining, and/or separating, semiconductor substrates (e.g., semiconductor wafers). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor package. The connection structures formed by the connection tool set 115 may include a wire, a stud, a pillar, a bump, or a solder ball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wire-bond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor package (e.g., the one or more IC dies after encapsulation). The ATE tool set 120 may perform wafer testing operations, known good die (KGD) testing operations, semiconductor package testing operations, or system-level (e.g., a circuit board populated with one or more semiconductor packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor package from a leadframe. Additionally, or alternatively, the singulation tool set 125 may include a router tool or a laser tool that removes the semiconductor package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies to the interposer, the leadframe, and/or the strip of the organic substrate material, among other examples. The die-attach tool set 130 may include a pick-and-place tool, a taping tool, a laminating tool, a reflow tool (e.g., a furnace), a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density interconnect (HDI) PCB, among other examples. In some implementations, the PCB tool set 140 forms the interposer and/or the substrate. The PCB tool set 140 may include a laminating tool, a plating tool, a photoengraving tool, a laser cutting tool, a pick-and-place tool, an etching tool, a dispense tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform a series of operations to form one or more portions of a semiconductor package. As described in greater detail in connection with FIGS. 2-7, and elsewhere herein, the series of operations may include forming a spacer structure on a bottom surface of an interposer, where forming the spacer structure includes forming a bottom surface of the spacer structure at a first distance from the bottom surface of the interposer. The series of operations includes attaching an IC die to the bottom surface of the interposer, where attaching the IC die to the bottom surface of the interposer includes positioning a bottom surface of the IC die at a second distance from the bottom surface of the interposer, where the second distance is lesser relative to the first distance. The series of operations includes attaching a substrate to the bottom surface of the interposer, where attaching the substrate to the bottom surface of the interposer includes positioning a top surface of the substrate at a third distance from the bottom surface of the interposer. In some implementations, the third distance is greater relative to the first distance.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2:
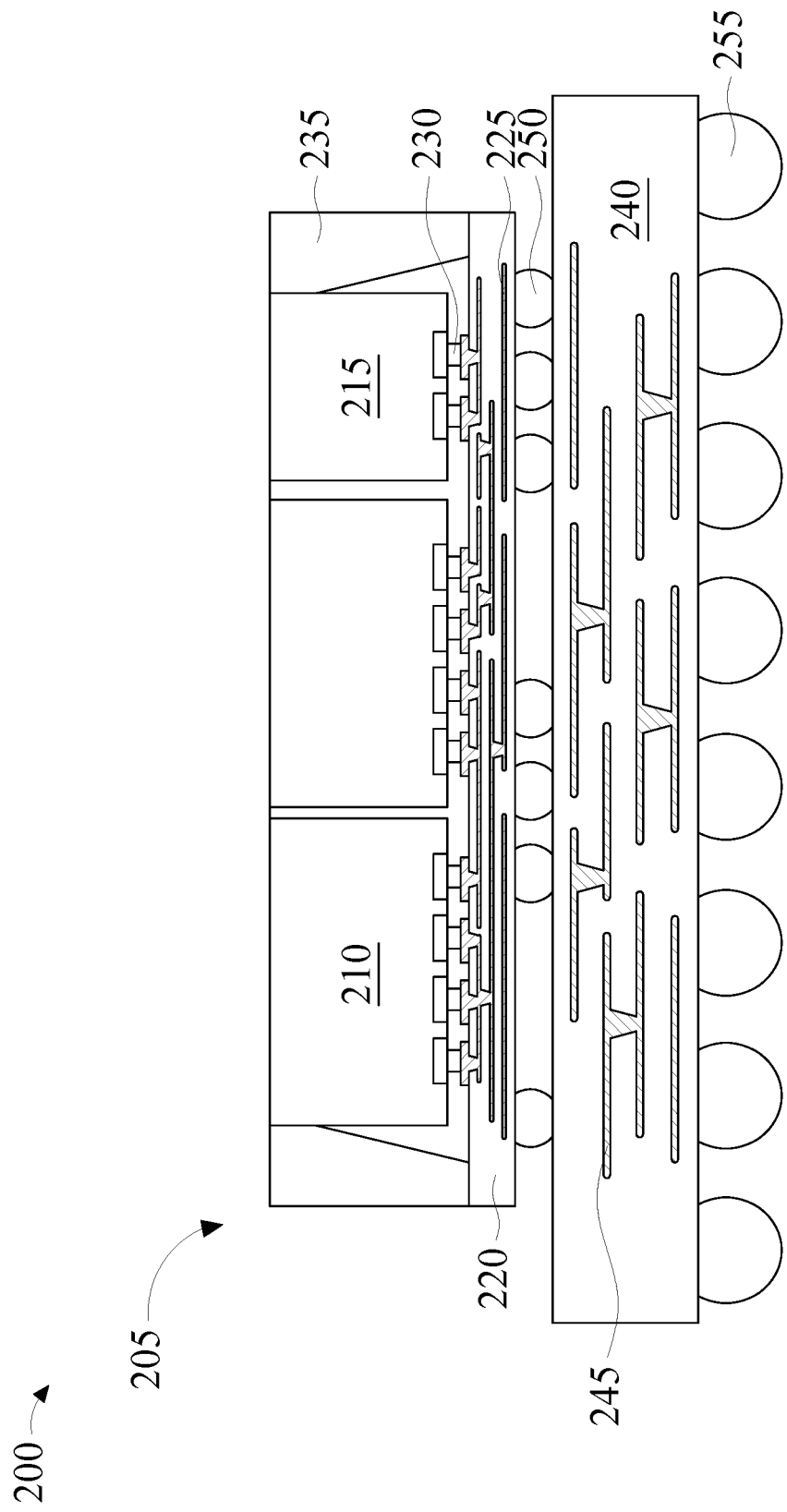
FIG. 2 is a diagram of an example implementation of a semiconductor package described herein.

FIG. 2 is a diagram of an example implementation 200 of a semiconductor package 205 described herein. In some implementations, the semiconductor package 205 corresponds to a high-performance computing (HPC) semiconductor package. Furthermore, FIG. 2 represents a side view of the of the semiconductor package 205.

The semiconductor package 205 may include one or more IC dies (e.g., a system-on-chip (SoC) IC die 210 and/or a dynamic random access memory (DRAM) IC die 215, among other examples). The semiconductor package 205 may include an interposer 220 having one or more layers of electrically-conductive traces 225. The interposer 220 may include one or more layers of a dielectric material, such as a ceramic material or a silicon material. In some implementations, the interposer 220 corresponds to a PCB including layers of a glass-reinforced epoxy laminate material and/or a pre-preg material (e.g., a composite fiber/resin/epoxy material), among other examples. Additionally, or alternatively, one or more layers of the interposer 220 may include a buildup film material.

The electrically-conductive traces 225 may include one or more materials such as a gold (Au) material, a copper (Cu) material, a silver (Ag) material, a nickel (Ni) material, a tin (Sn) material, or a palladium (Pd) material, among other examples. In some implementations, the interposer 220 includes one or more conductive vertical access connection structures (vias) that connect one or more layers of the electrically-conductive traces 225.

As shown in FIG. 2, the SoC IC die 210 and the DRAM IC die 215 are connected (e.g., mounted) to the interposer 220 using a plurality of connection structures 230. The connection structures 230 may include one or more combinations of a stud, a pillar, a bump, or a solder ball, among other examples. The connection structures 230 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 230 may connect lands (e.g., pads) on bottom surfaces of the SoC IC die 210 and the DRAM IC die 215 to lands on a top surface of the interposer 220. In some implementations, the connection structures 230 may include one or more electrical connections for signaling (e.g., corresponding lands of the SoC IC die 210, the DRAM IC die 215, and the interposer 220 are electrically connected to respective circuitry and/or traces of the SoC IC die 210, the DRAM IC die 215, and the interposer 220).

In some implementations, the connection structures 230 may include one or more mechanical connections for attachment purposes and/or spacing purposes (e.g., corresponding lands of the SoC IC die 210, the DRAM IC die 215, and the interposer 220 are not electrically connected to respective circuitry and/or traces of the SoC IC die 210, the DRAM IC die 215, and the interposer 220). In some implementations, one or more of the connection structures 230 may function both electrically and mechanically.

A mold compound 235 may encapsulate one or more portions of the semiconductor package 205, including portions of the SoC IC die 210 and/or the DRAM IC die 215. The mold compound 235 (e.g., a plastic mold compound, among other examples) may protect the SoC IC die 210 and/or the DRAM IC die 215 from damage during manufacturing of the semiconductor package 205 and/or during field use of the semiconductor package 205.

The semiconductor package 205 may include a substrate 240 having one or more layers of electrically-conductive traces 245. The substrate 240 may include one or more layers of a dielectric material, such as a ceramic material or a silicon material. In some implementations, the substrate 240 corresponds to a PCB including layers of a glass-reinforced epoxy laminate material and/or a pre-preg material (e.g., a composite fiber/resin/epoxy material), among other examples. Additionally, or alternatively, one or more layers of the substrate 240 may include a buildup film material.

The electrically-conductive traces 245 may include one or more materials such as a gold (Au) material, a copper (Cu) material, a silver (Ag) material, a nickel (Ni) material, a tin (Sn) material, or a palladium (Pd) material, among other examples. In some implementations, the substrate 240 includes one or more conductive vertical access connection structures (vias) that connect one or more layers of the electrically-conductive traces 245.

As shown in FIG. 2, the interposer 220 is connected (e.g., mounted) to the substrate 240 using a plurality of connection structures 250. The connection structures 250 may include one or more combinations of a stud, a pillar, a bump, or a solder ball, among other examples. In some implementations, the connection structures 250 correspond to controlled collapse chip connection (C4) connection structures. The connection structures 250 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 250 may connect lands (e.g., pads) on a bottom surface of the interposer 220 to lands on a top surface of the substrate 240. In some implementations, the connection structures 250 may include one or more electrical connections for signaling (e.g., corresponding lands of the interposer 220 and the substrate 240 are electrically connected to respective circuitry and/or traces of the interposer 220 and the substrate 240). In some implementations, the connection structures 250 may include or more mechanical connections for attachment purposes and/or spacing purposes (e.g., corresponding lands of the interposer 220 and the substrate 240 are not electrically connected to respective circuitry and/or traces of the interposer 220 and the substrate 240). In some implementations, one or more of the connection structures 250 may function both electrically and mechanically.

The semiconductor package 205 may include a plurality of connection structures 255 connected to lands (e.g., pads) on a bottom surface of the substrate 240. The connection structures 255 may include one or more combinations of a stud, a pillar, a bump, or a solder ball, among other examples. The connection structures 255 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free). In some implementations, the connection structures 255 correspond to C4 connection structures.

The connection structures 255 may be used to attach the semiconductor package 205 (e.g., the substrate 240) to a circuit board (not shown) using a surface mount (SMT) process. In some implementations, the connection structures 255 may provide an electrical connection for signaling (e.g., corresponding lands of the substrate 240 and the circuit board may be electrically connected to respective circuitry and/or traces of the substrate 240 and the circuit board). In some implementations, the connection structures 255 may provide a mechanical connection to the circuit board for attachment purposes and/or spacing purposes (e.g., corresponding lands of the substrate 240 and the circuit board may not be electrically connected to respective circuitry and/or traces of the substrate 240 and the circuit board). In some implementations, one or more of the connection structures 255 may provide both mechanical and electrical connections.

The semiconductor package 205 may include one or more additional features. As described in greater detail in connection with FIGS. 3-7, and elsewhere herein, the semiconductor package 205 includes a substrate (e.g., the substrate 240) including a top surface and an interposer (e.g., interposer 220) including a bottom surface facing the top surface of the substrate. The semiconductor package 205 further includes an IC die electrically connected to a bottom surface of the interposer and a spacer structure mechanically connected to the bottom surface of the interposer. The spacer structure is disposed beside the IC die, a first distance between the spacer structure and the substrate is no more than a second distance between the IC die and the substrate. The semiconductor package 205 further include a plurality of connection structures (e.g., the connection structures 250), where the plurality of connection structures electrically and/or mechanically connect the substrate and the interposer.

Additionally, or alternatively, and as described in greater detail in connection with FIGS. 3-7, a semiconductor structure of the semiconductor package 205 includes an interposer (e.g., the interposer 220) having a bottom surface. The semiconductor structure includes a spacer structure electrically and/or mechanically connected to the bottom surface of the interposer, where the spacer structure includes a bottom surface at a first distance from the bottom surface of the interposer. The semiconductor structure includes an IC die electrically and mechanically connected to the bottom surface of the interposer, where the IC die includes a bottom surface at a second distance from the bottom surface of the interposer that is lesser relative to the first distance.

As indicated above, FIG. 2 is provided as an example. Other examples may differ from what is described with regard to FIG. 2.

Figure 3:
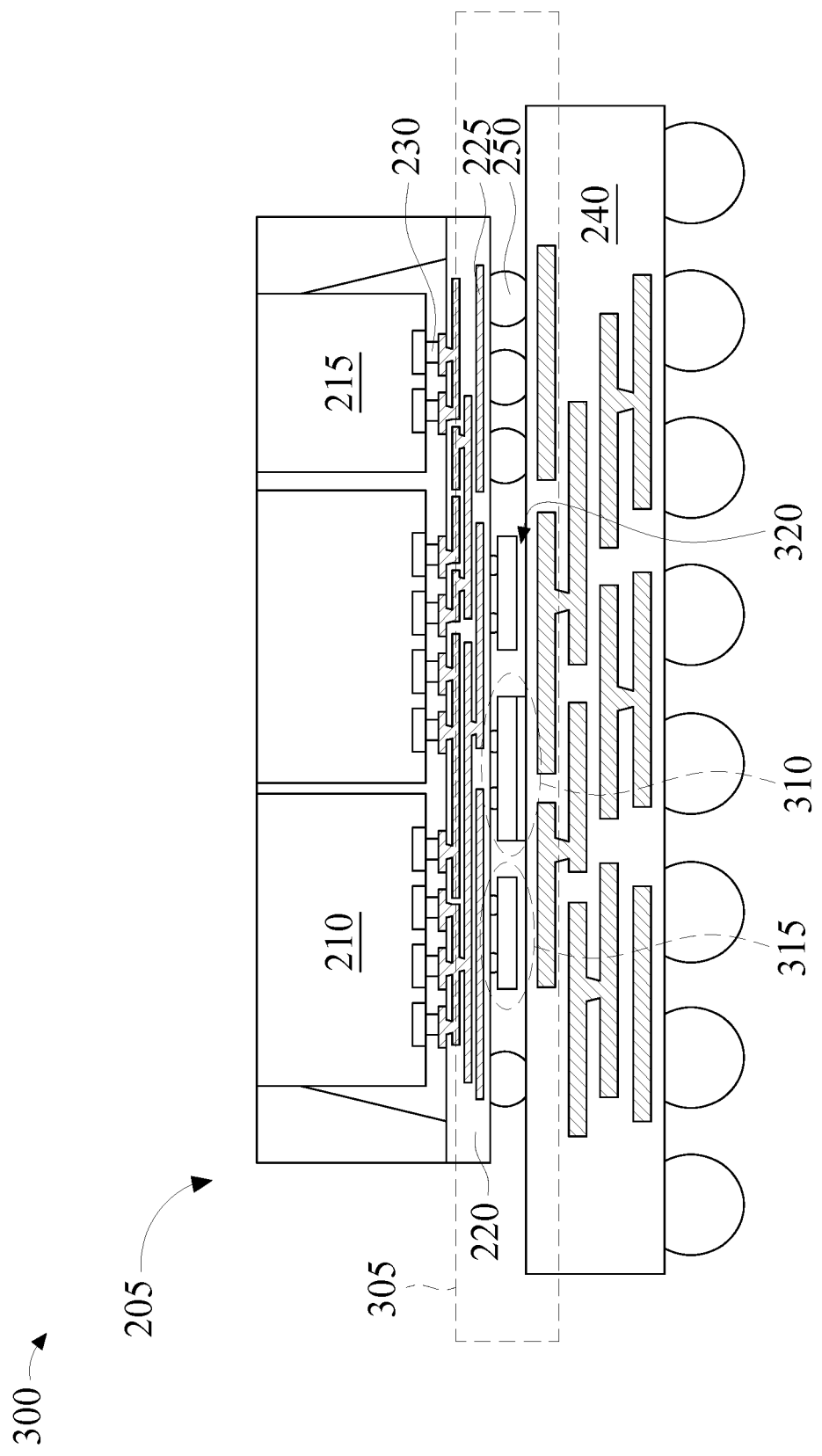

FIG. 3 is a diagram of an example implementation 300 described herein. Example implementation 300 may include one or more portions of the semiconductor package 205 formed using a combination of operations performed by one or more of the semiconductor processing tools 105-150 as described in connection with FIG. 1. In example implementation 300, a portion 305 of the semiconductor package 205 includes a spacer structure 310 and an IC die 315 (e.g., an integrated passive IC die, among other examples). In some implementations, the spacer structure 310 is configured to maintain a clearance 320 between a bottom surface of the IC die 315 and a top surface of the substrate 240. Furthermore, FIG. 3 represents a side view of the semiconductor package 205.

During a manufacturing operation that handles the semiconductor package 205 (e.g., during a socketing of the semiconductor package 205 in a tool of the ATE tool set 120 or during a mounting of the semiconductor package 205 to a PCB by a tool of the SMT tool set 145, among other examples), a bending moment may be applied to the semiconductor package 205. The spacer structure 310 may reduce a flexure resulting from the bending moment to maintain the clearance 320. By maintaining the clearance 320, a likelihood of damage to the IC die 315 (e.g., chipping) and/or damage to the interposer 220 (e.g., impingements) is reduced. Additionally, the spacer structure 310 may reduce bending in the interposer 220 to reduce a likelihood of damage to the electrically-conductive traces 225 (e.g., cracking), damage to solder joints of the connection structures 230 (e.g., fracturing or shearing), and/or damage to solder joints of the connection structures 250 (e.g., fracturing or shearing) to improve a robustness, a quality, and/or a reliability of the semiconductor package 205.

As indicated above, FIG. 3 is provided as an example. Furthermore, and as described in connection with FIGS. 4A-4G and elsewhere herein, there may be additional features, different features, or differently arranged features than those shown in FIG. 3.

FIGS. 4A-4G are diagrams of an example implementation 400 described herein. The implementation 400 includes one or more example configurations of the semiconductor package 205 including the spacer structure 310. Furthermore, FIGS. 4A-4G represent side views of the portion 305 of the semiconductor package 205.

Figure 4A:
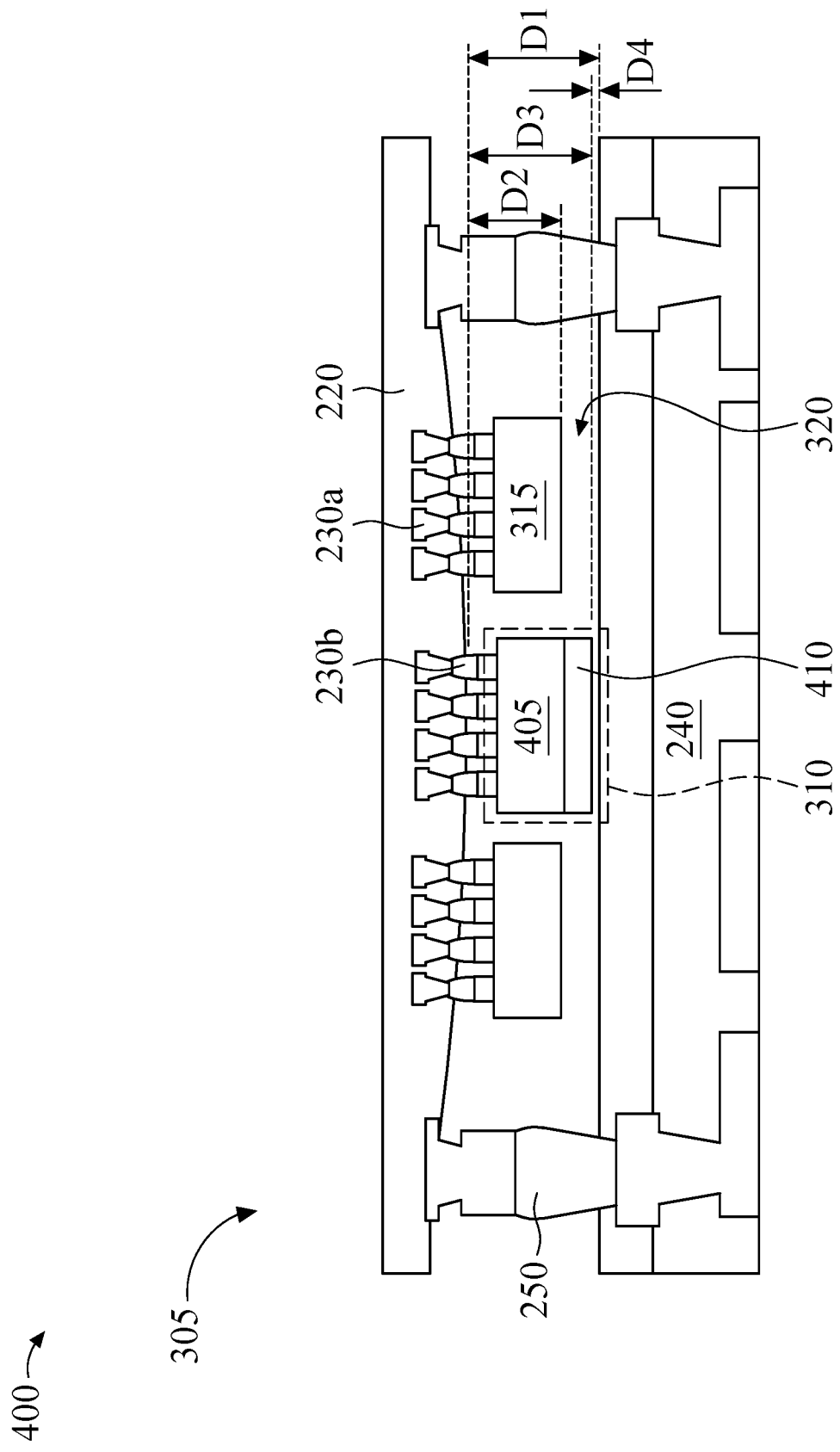

In FIG. 4A, the portion 305 of the semiconductor package 205 includes the interposer 220 and the substrate 240. The interposer 220 includes a bottom surface facing a top surface of the substrate 240. The portion 305 further includes an IC die 315 (e.g., an integrated passive IC die, among other examples) mechanically and/or electrically connected to the bottom surface of the interposer 220 using the connection structures 230a (e.g., a first plurality of connection structures). In FIG. 4A, the spacer structure 310 is mechanically and/or electrically connected to the bottom surface of interposer 220 using the connection structures 230b (e.g., a second plurality of connection structures).

The spacer structure 310 may include a portion corresponding to a support component 405 and a portion corresponding to a layer of material 410 over a surface of the support component 405. As shown in FIG. 4A, the layer of material 410 is located between the support component 405 and the top surface of the substrate 240. The support component 405 may, for example, correspond to a stud element, and is not limited thereto.

The support component 405 may include a silicon material or a metal material, among other examples. The layer of material 410 may include a die-attach film material (e.g., a die-attach film layer), a buildup film material (e.g., a buildup film layer), or a polymer material (e.g., a polymer layer), among other examples. In some implementations, the layer of material 410 includes an elastic (e.g., compliant) property.

Different techniques and/or tool sets may be used to form portions of the spacer structure 310 on the bottom surface of the interposer 220. For example, one or more tools of the RDL tool set 105 (e.g., one or more of the photolithography tools, the deposition tools, and/or the etch tools, among other examples) may use a photolithography patterning process to form land patterns (e.g., pads) on the support component 405 of the spacer structure 310. In some implementations, the RDL tool set 105 may form traces on or within layers of the support component 405. Additionally, or alternatively, one or more tools of the singulation tool set 125 (e.g., the dicing tool, among other examples) may use a dicing process to excise the support component 405 from the semiconductor substrate. Additionally, or alternatively, one or more tools of the connection tool set 115 (e.g., the bumping tool, among other examples) may form the connection structures 230b on a top surface of the support component 405 and/or bottom surface of interposer 220. Additionally, or alternatively, one or more of the tools of the die-attach tool set 130 (e.g., the taping tool, or the lamination tool, among other examples) may use a lamination process to form the layer of material 410 portion of the spacer structure 310 on the surface of the support component 405. Additionally, or alternatively, one or more tools of the die-attach tool set 130 (e.g., the pick-and-place tool and/or the reflow tool, among other examples) may attach the support component 405 to the bottom surface of the interposer 220. In some implementations, the techniques and/or tool sets used to attach the support component 405 to the bottom surface of the interposer 220 may be the same as techniques and/or tool sets used to attach the IC die 315 to the bottom surface of the interposer 220.

As shown in FIG. 4A, a stackup of dimensions associated with manufacturing process capabilities and material tolerances may configure the spacer structure 310 to maintain the clearance 320 between bottom surface of the IC die 315 and the top surface of the substrate 240. The stackup of the spacer structure 310 may include a distance D1 from the bottom surface of the interposer 220 to the top surface of the substrate 240. In some implementations, and as an example, the distance D1 is included in a range of approximately 135 microns to approximately 160 microns. However, other values and ranges for the distance D1 are within the scope of the present disclosure.

Additionally, or alternatively, the stackup may include a distance D2 from the bottom surface of the interposer 220 to a bottom surface of the IC die 315. In some implementations, and as an example, the distance D2 is included in a range of approximately 50 microns to approximately 120 microns. However, other values and ranges for the distance D2 are within the scope of the present disclosure.

Additionally, or alternatively, the stackup may include a distance D3 from the bottom surface of the interposer 220 to a bottom surface of the spacer structure 310. In some implementations, the distance D3 is greater relative to D2 (e.g., the distance D2 is lesser relative to D3). In some implementations, and as an example, the distance D3 is greater than approximately 120 microns. If the distance D3 is equal to or less than 120 microns, damage to the IC die 315 and/or the substrate 240 may occur during a flexure of interposer 220. However, other values and ranges for the distance D3 are within the scope of the present disclosure.

Additionally, or alternatively, the stackup may include a distance D4 from the bottom surface of the spacer structure 310 to the top surface of the substrate 240. For the stackup including the example distances D1-D3, the distance D4 may be included in a range of approximately 1 micron to approximately 20 microns. If the distance D4 is less that approximately 1 micron, a flexure in the interposer 220 (and/or the substrate 240) during handling or processing of the semiconductor package 205 (e.g., during testing by the ATE tool set 120 or mounting by the SMT tool set 145, among other examples) may cause damage to the IC die 315 and/or the substrate 240. If the distance D4 is greater than approximately 20 microns, a flexure of interposer 220 during the handling or processing of the semiconductor package 205 may occur and cause damage to the interposer 220, damage to the electrically-conductive traces 225, damage to solder joints of the connection structures 230, and/or damage to solder joints of the connection structures 250. However, other values for the distance D4 are within the scope of the present disclosure.

Figure 4B:
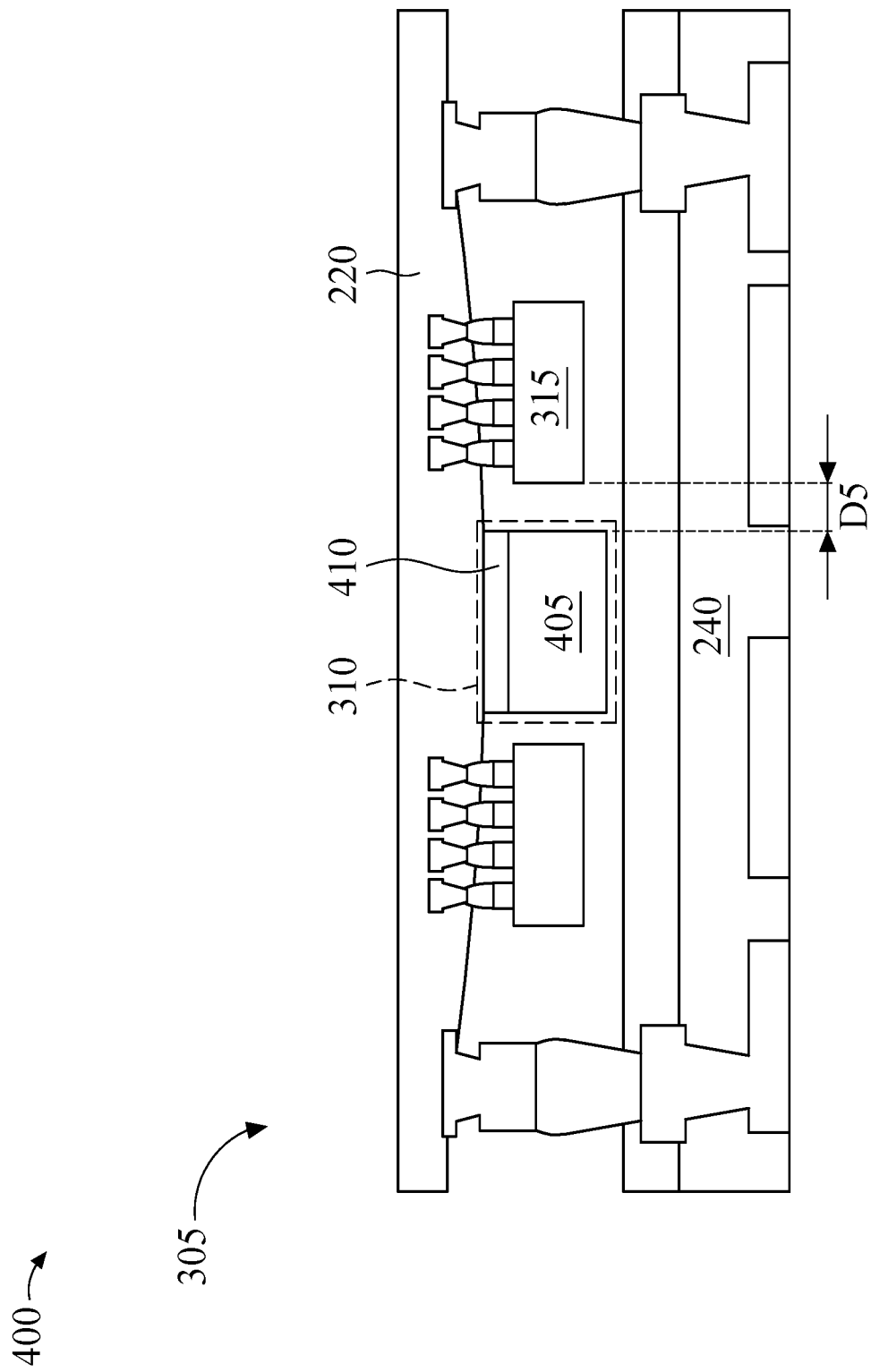

FIG. 4B shows an example of the portion 305 including the spacer structure 310. In FIG. 4B, the layer of material 410 is between the support component 405 and the interposer 220. Additionally, as shown in FIG. 4B, an edge of the spacer structure 310 and an edge of the IC die 315 may be separated by a distance D5. In some implementations, the distance is greater than approximately 150 microns. If the distance D5 is less than approximately 150 microns, chipping to the IC die 315 and/or the spacer structure 310 may occur during a flexure of the interposer 220.

Figure 4C:
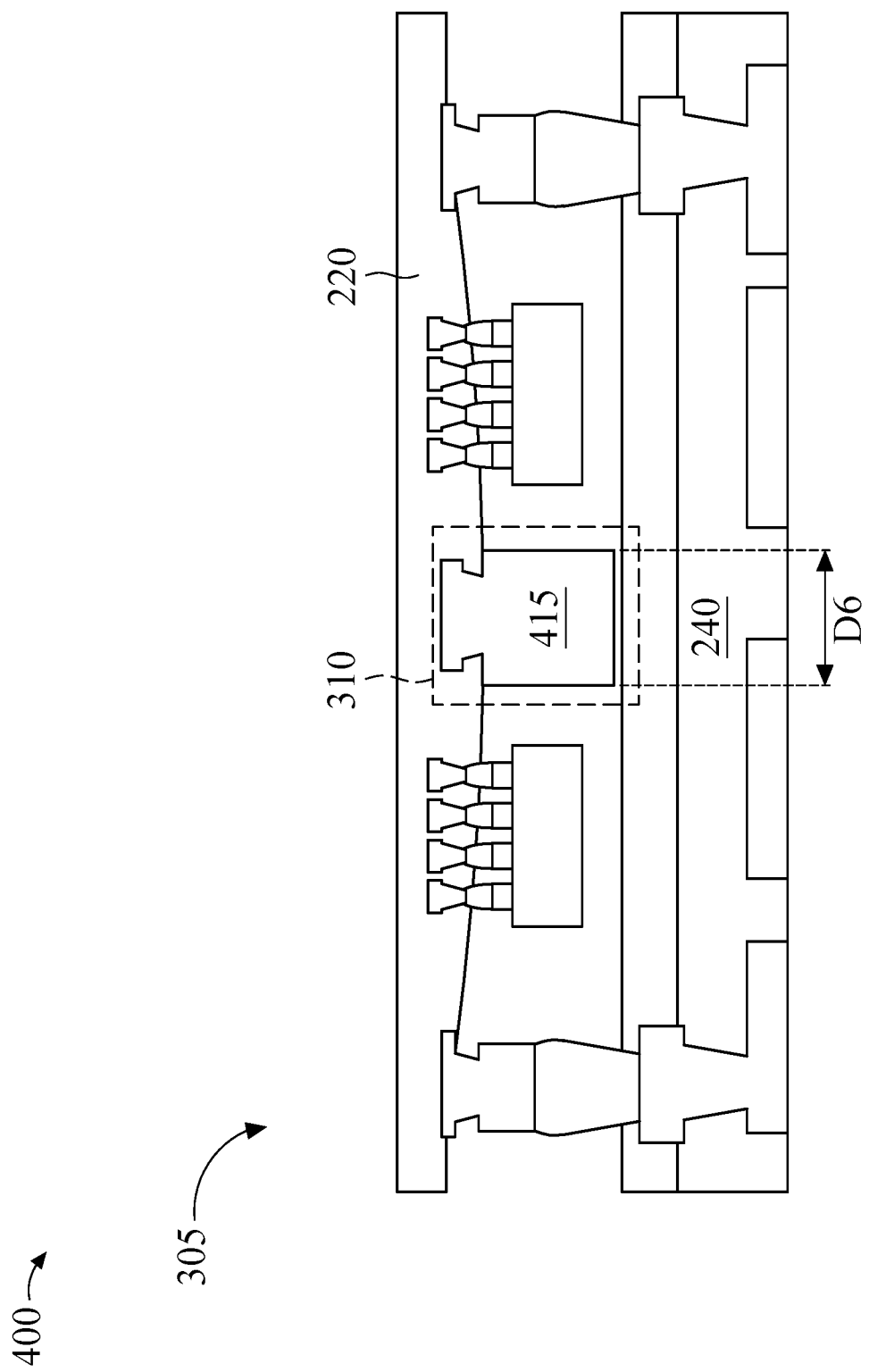

FIG. 4C shows an example of the portion 305 including the spacer structure 310. As shown in FIG. 4C, the spacer structure 310 may include a metal pillar structure 415. The metal pillar structure 415 may include a cross-sectional shape that is round, square, rectangular, triangular, elliptical, or a combination thereof, among other examples. In a case of substantial flexure of the interposer 220, a bottom surface of the metal pillar structure 415 may contact the top surface of the substrate 240. In some implementations, and as shown in FIG. 4C, the spacer structure 310 includes a width D6. The width D6 may be included in a range of approximately 40 microns to approximately 1000 microns. However, other values and ranges for the width D6 are within the scope of the present disclosure.

Different techniques and/or tool sets may be used to form the metal pillar structure 415. For example, the plating tool of the RDL tool set 105, the plating tool of the connection tool set 115, or the plating tool of the PCB tool set 140, among other examples, may perform a plating operation as part of forming the metal pillar structure 415 on the bottom surface of the interposer 220.

Figure 4D:
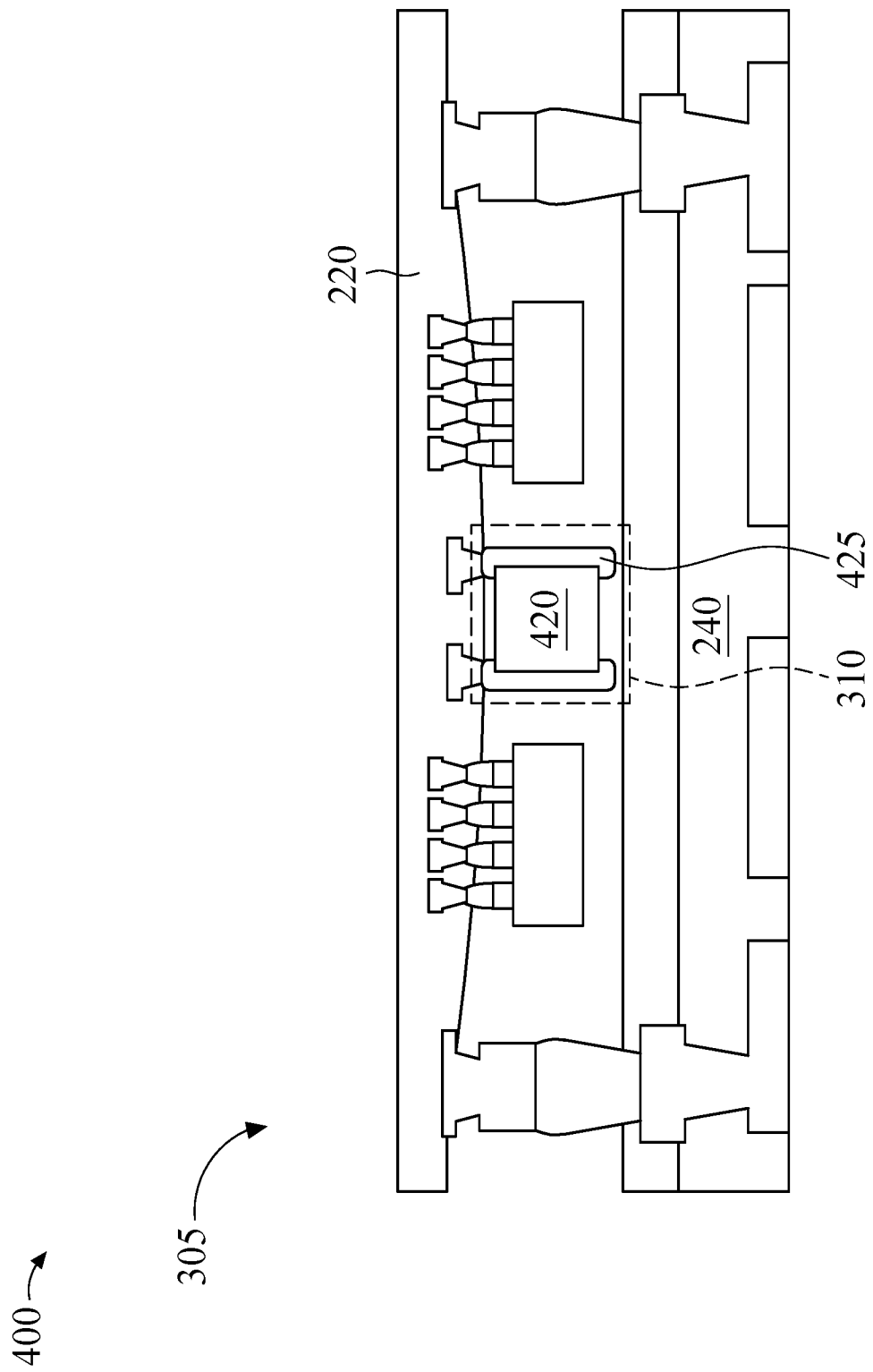

FIG. 4D shows an example of the portion 305 including the spacer structure 310. As shown in FIG. 4D, the spacer structure 310 may include a passive IC device. For example, and as shown in FIG. 4D, the spacer structure 310 may include a ceramic capacitor 420 having electrodes 425 on opposing sides of the ceramic capacitor 420. In a case of substantial flexure of the 220, a bottom surface of the ceramic capacitor 420 having the electrodes 425 may contact a top surface of the substrate 240.

Different techniques and/or tool sets may be used to form the spacer structure 310 including the passive IC device. For example, the pick-and-place tool and the reflow tool of the die-attach tool set 130, among other examples, may perform a series of operations to attach the ceramic capacitor 420 having the electrodes 425 to the bottom surface of the interposer 220.

Figure 4E:
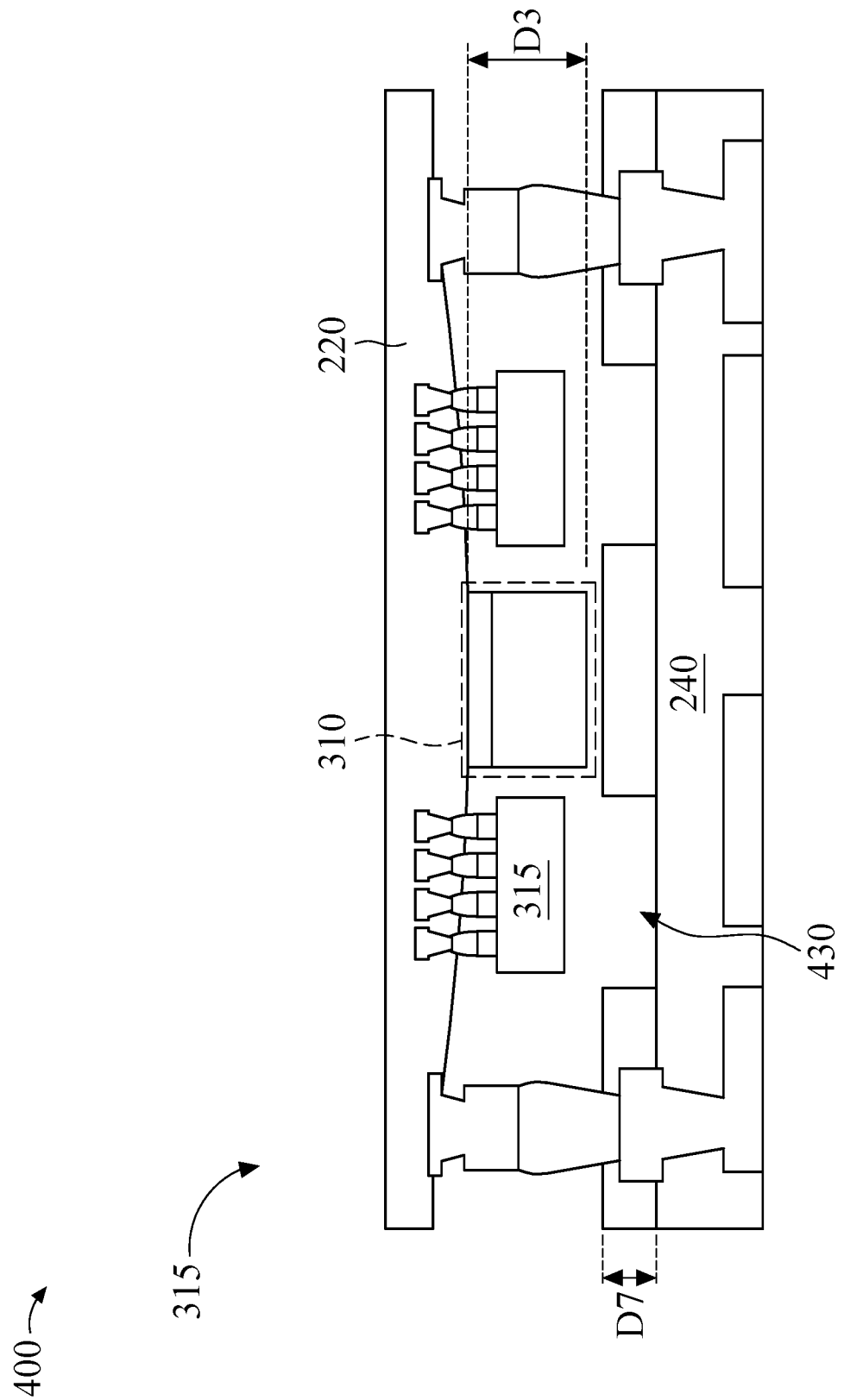

FIG. 4E shows an example of the portion 305 including the spacer structure 310. As shown in FIG. 4E, and in addition to the spacer structure 310, the portion 305 includes a recess 430 in the substrate 240. The recess 430 may be recess aligned with the IC die 315 connected to the bottom surface of the interposer 220. Additionally, and in some implementations, the outline of the recess 430 encompasses an outline of the IC die 315. During a flexure of the interposer 220, the recess 430 may further reduce a likelihood of chipping to the IC die 315 by providing additional clearance between the IC die 315 and the substrate 240.

The recess 430 may include a depth D7 (e.g., measured between a top surface of the substrate 240 and a bottom surface of the recess 430). In some implementations, a ratio of the depth D7 to a height of the spacer structure 310 (e.g., the distance D3 from the bottom surface of the interposer 220 to the bottom surface of the spacer structure 310) is included in a range of up to approximately 1:2 (e.g., 50%). If the ratio is greater than approximately 1:2, circuitry and/or traces of the substrate 240 (e.g., the electrically-conductive traces 245) may be exposed. However, other values and ranges for such a ratio are within the scope of the present disclosure.

Different techniques and/or tool sets may be used to form the recess 430. For example, the laser cutting tool of the PCB tool set 140, among other examples, may ablate the recess 430 in the top surface of the substrate 240.

FIG. 4F shows an example of the portion 305 including the spacer structure 310. As shown in FIG. 4F, the spacer structure 310 may be included at a location 435 that is below at least one IC die (e.g., the DRAM IC die 215, among other examples). As shown in FIG. 4F, the spacer structure 310 may be configured as an electromagnetic shield that shields an electromagnetic field 440 originating from the IC die.

Figure 4G:
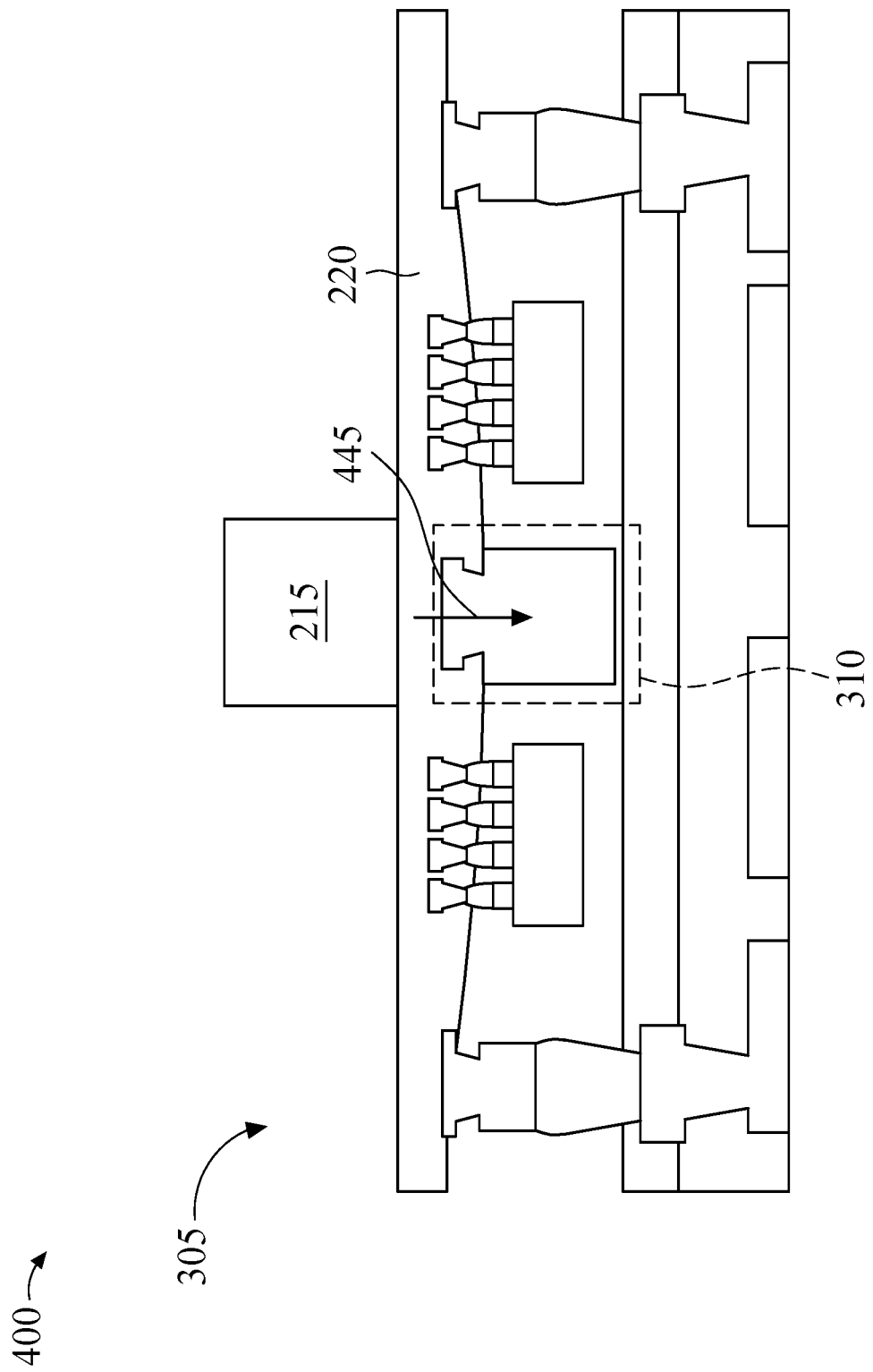

FIG. 4G shows an example of the portion 305 including the spacer structure 310. As shown in FIG. 4G, the spacer structure 310 may be included at a location that is below at least one IC die (e.g., the DRAM IC die 215, among other examples). In the example of FIG. 4G, the spacer structure 310 may include a material having a thermal capacitance (e.g., joules per kelvin) that is greater relative to a thermal capacitance of a material of the interposer 220. In such a case, the spacer structure 310 may be further configured as a heatsink that receives heat 445 from the IC die.

Each of the dimensions described in connection with respective FIGS. 4A-4E (e.g., D1 -D7) may be combinable and/or apply cross FIGS. 4A-4G. However, other combinations of other dimensions are within the scope of the present disclosure.

The number and arrangement of features of the portion 305 of the semiconductor package 205 in FIGS. 4A-4G are provided as one or more examples. In practice, there may be additional features, different features, or differently arranged features than those shown in FIGS. 4A-4G.

Figure 5:
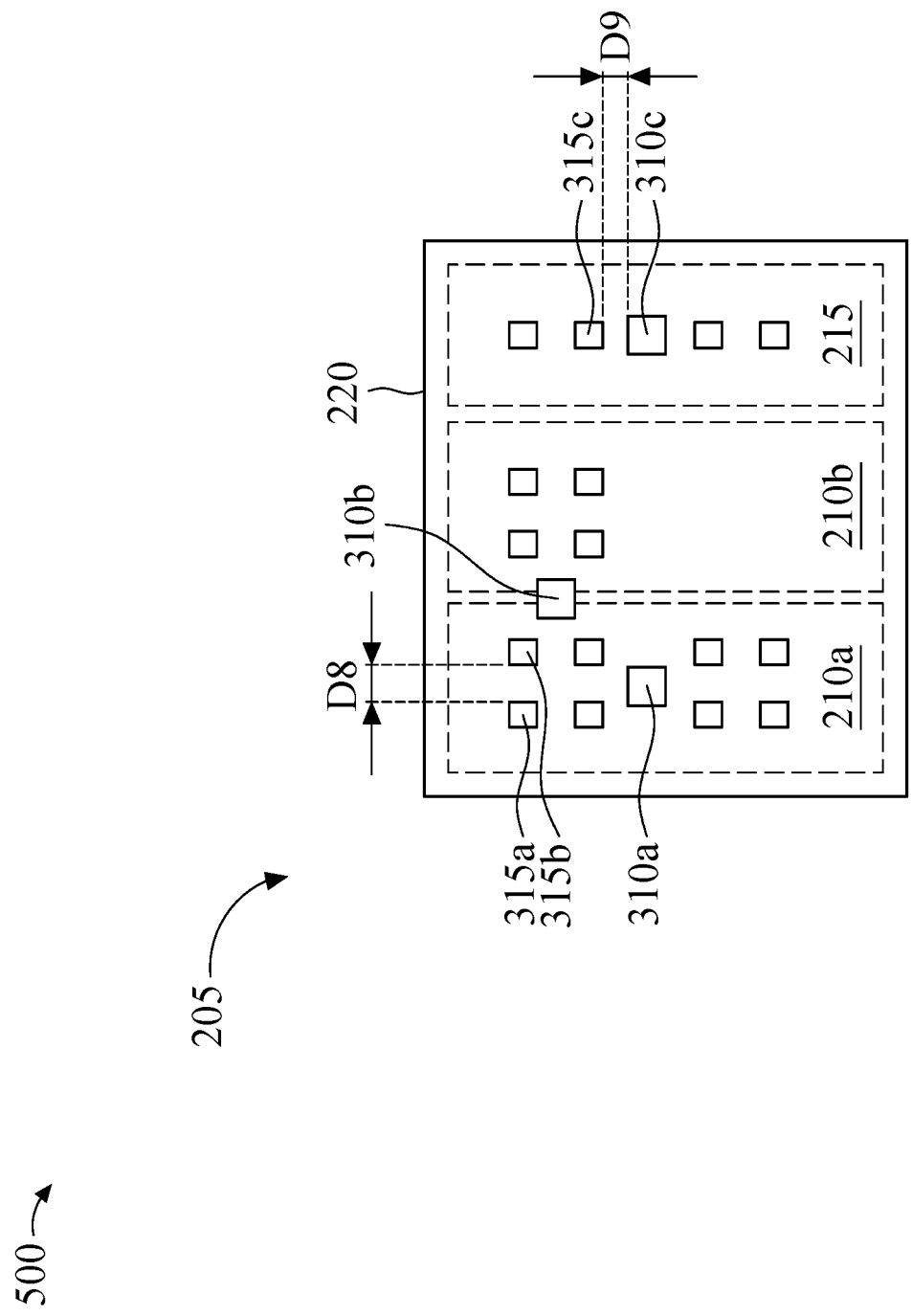

FIG. 5 is a diagram of an example implementation 500 described herein. The implementation 500 includes an example layout of the semiconductor package 205. Furthermore, FIG. 5 represents a top view of the semiconductor package 205.

In FIG. 5, the semiconductor package 205 may correspond to a high-performance computing (HPC) package or a multi-chip package (MPC), among other examples. The semiconductor package includes the SoC IC die 210a, the SoC IC die 210b, and the DRAM IC die 215 mounted to the top surface of the interposer 220. Additionally, the semiconductor package 205 includes multiple spacer structures (e.g., spacer structures 310a-310c) and multiple passive IC dies (e.g., IC dies 315a-315c) mounted to the bottom surface of the interposer 220.

The layout of the semiconductor package 205 may include a combination of spacings. As an example, a spacing D8 between the IC die 315a and the IC die 315b may be greater than or equal to approximately 150 microns, among other examples. Additionally, or alternatively, a spacing D9 between the spacer structure 310c and the IC die 315c may be greater than or equal to approximately 150 microns, among other examples. However, other values and ranges for the spacings D8 and D9 are within the scope of the present disclosure.

Additionally, or alternatively, the layout may include one or more area ratios. For example, a ratio of an area of the IC dies 315a-315c (including additional IC dies) to an area of the interposer 220 may be included in a range of approximately 1:200 (e.g., 0.5%) to approximately 1:5 (e.g., 20%). Additionally, or alternatively, a ratio of an area of the spacer structures 310a-310c to an area of the interposer 220 may be included in a range of approximately 1:200 (e.g., 0.5%) to approximately 1:20 (e.g., 5%). However, other values and ranges for such ratios are within the scope of the present disclosure.

The number and arrangement of features associated with the layout of the semiconductor package 205 in FIG. 5 is provided as an example. In practice, there may be additional features, different features, or differently arranged features than those shown in FIG. 5.

Figure 6:
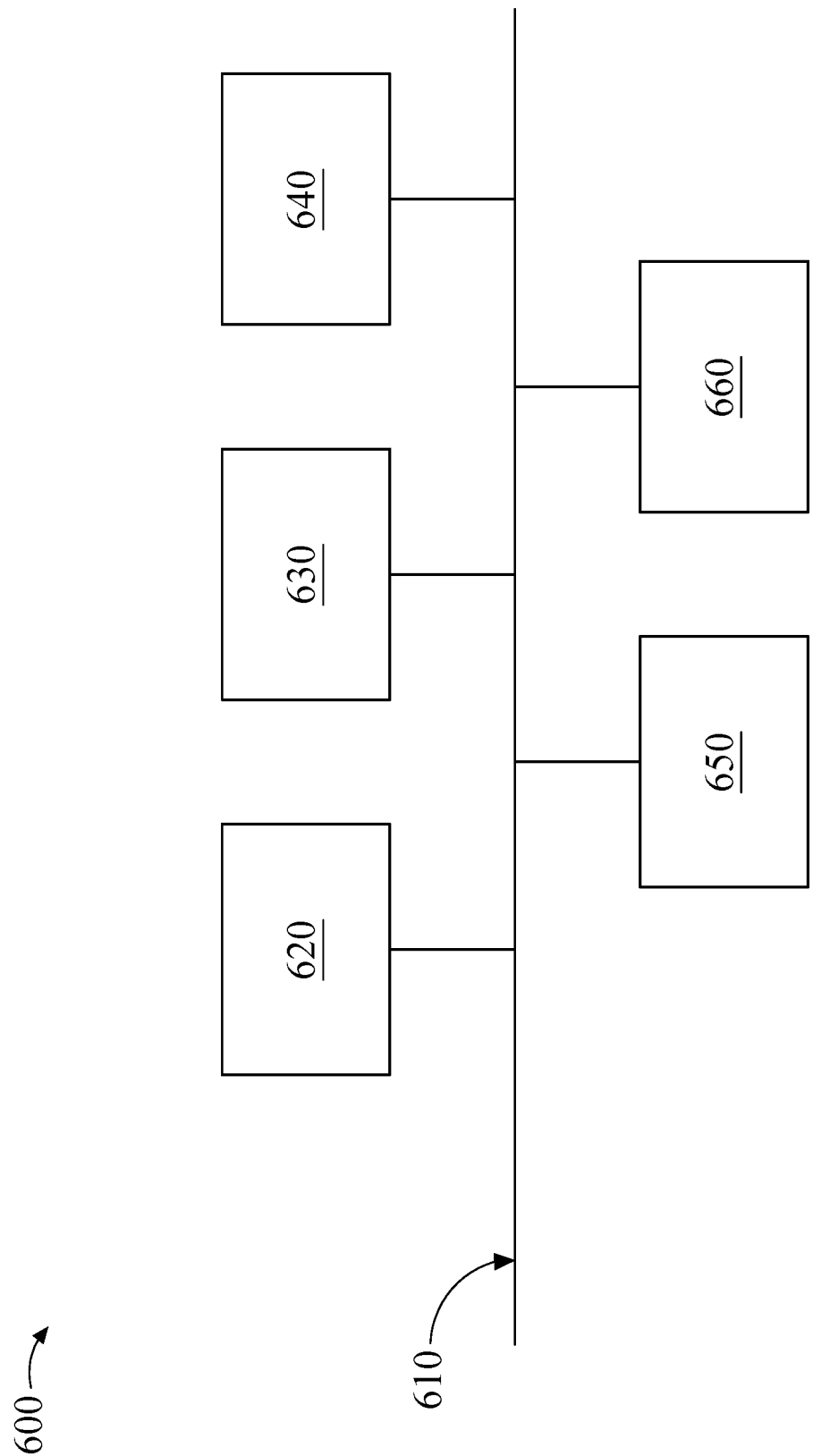
FIG. 6 is a diagram of example components of one or more devices of FIG. 1 described herein.

FIG. 6 is a diagram of example components of a device 600, which may correspond to one or more of the semiconductor processing tool sets 105-150. In some implementations, the semiconductor processing tool sets 105-150 include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
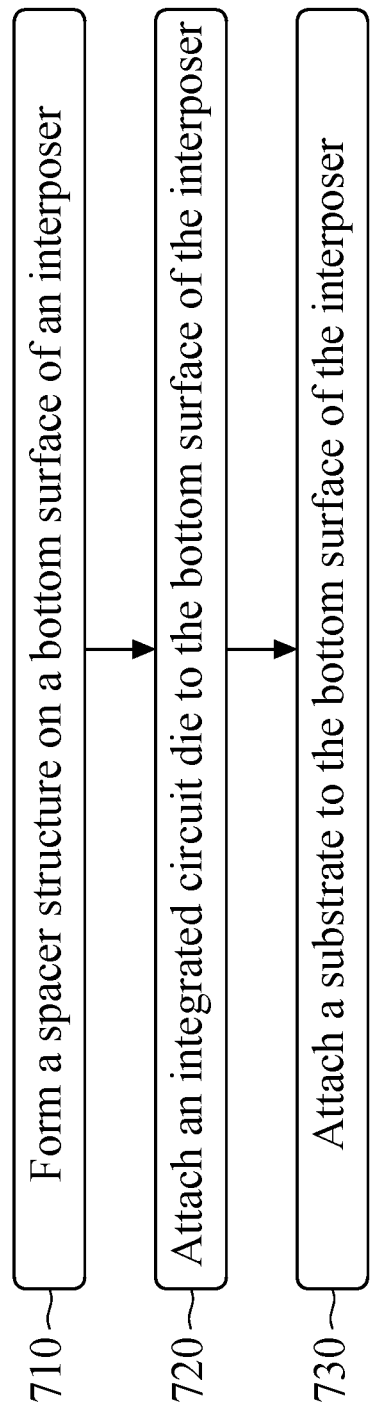
FIG. 7 is a flowchart of an example process associated with forming a semiconductor package described herein.

FIG. 7 is a flowchart of an example process associated with forming a semiconductor package described herein. In some implementations, one or more process blocks of FIG. 7 are performed by one or more of the semiconductor processing tool sets 105-150. Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming a spacer structure on a bottom surface of an interposer (block 710). For example, one or more of the semiconductor processing tool sets 105-115, such as die-attach tool set 130, may perform a series of operations to form a spacer structure 310 on a bottom surface of an interposer 220, as described above. In some implementations, forming the spacer structure 310 includes forming a bottom surface of the spacer structure 310 at a first distance D3 from the bottom surface of the interposer 220.

As further shown in FIG. 7, process 700 may include attaching an IC die to the bottom surface of the interposer (block 720). For example, one or more of the semiconductor processing tool sets 105-115, such as the die-attach tool set 130, may perform a series of operations to attach an IC die 315 to the bottom surface of the interposer 220 as described above. In some implementations, attaching the IC die 315 to the bottom surface of the interposer 220 includes positioning a bottom surface of the IC die 315 at a second distance D2 from the bottom surface of the interposer 220. In some implementations, the second distance D2 is lesser relative to the first distance D3.

As further shown in FIG. 7, process 700 may include attaching a substrate to the bottom surface of the interposer (block 730). For example, one or more of the semiconductor processing tool sets 105-115, such as the connection tool set 115 and/or the die-attach tool set 130, may perform a series of operations to attach a substrate 240 to the bottom surface of the interposer 220, as described above. In some implementations, attaching the substrate 240 to the bottom surface of the interposer 220 includes positioning a top surface of the substrate 240 at a third distance D1 from the bottom surface of the interposer 220. In some implementations, the third distance D1 is greater relative to the first distance D3.

Process 700 may include additional implementations, such as any single implementation or any combination of implementations described below and/or in connection with one or more other processes described elsewhere herein.

In a first implementation, forming the spacer structure 310 includes forming a portion of the spacer structure 310 using a photoresist patterning process.

In a second implementation, alone or in combination with the first implementation, forming the spacer structure 310 includes forming a portion of the spacer structure 310 using a surface mount process.

In a third implementation, alone or in combination with one or more of the first and second implementations, forming the spacer structure 310 includes forming a portion of the spacer structure 310 using a lamination process.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations herein describe a semiconductor package. The semiconductor package, which may correspond to a high-performance computing (HPC) package, includes an interposer over a substrate. A spacer structure is mounted to a bottom surface of the interposer. The spacer structure is configured to maintain a clearance between a bottom surface of an IC die mounted to the bottom surface of the interposer and a top surface of the substrate to reduce a likelihood of an interference or collision between the IC die and the substrate.

In this way, a likelihood of damage to the IC die and/or the substrate is reduced. Additionally, a robustness of an electrical connection between the IC die and the interposer may increase to improve a reliability and/or a yield of the semiconductor package including the spacer structure.

As described in greater detail above, some implementations described herein provide a semiconductor package. The semiconductor package includes a substrate comprising a top surface. The semiconductor package includes an interposer comprising a bottom surface facing the top surface of the substrate. The semiconductor package includes an integrated circuit die electrically connected to a bottom surface of the interposer. The semiconductor package includes a spacer structure mechanically connected to the bottom surface of the interposer, where the spacer structure is disposed beside the integrated circuit die, a first distance between the spacer structure and the substrate is no more than a second distance between the integrated circuit die and the substrate. The semiconductor package includes a plurality of connection structures, where the plurality of connection structures electrically and/or mechanically connect the substrate and the interposer.

As described in greater detail above, some implementations described herein provide a method. The method includes forming a spacer structure on a bottom surface of an interposer, where forming the spacer structure includes forming a bottom surface of the spacer structure at a first distance from the bottom surface of the interposer. The method includes attaching an integrated circuit die to the bottom surface of the interposer, where attaching the integrated circuit die to the bottom surface of the interposer includes positioning a bottom surface of the integrated circuit die at a second distance from the bottom surface of the interposer, and where the second distance is lesser relative to the first distance. The method includes attaching a substrate to the bottom surface of the interposer, where attaching the substrate to the bottom surface of the interposer includes positioning a top surface of the substrate at a third distance from the bottom surface of the interposer, and where the third distance is greater relative to the first distance.

As described in greater detail above, some implementations described herein provide a semiconductor structure. The semiconductor structure includes an interposer having a bottom surface. The semiconductor structure includes a spacer structure electrically and/or mechanically connected to the bottom surface of the interposer, where the spacer structure includes a bottom surface at a first distance from the bottom surface of the interposer. The semiconductor structure includes an integrated circuit die electrically and mechanically connected to the bottom surface of the interposer, where the integrated circuit die includes a bottom surface at a second distance from the bottom surface of the interposer that is lesser relative to the first distance.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a substrate comprising a top surface;
    an interposer comprising a bottom surface facing the top surface of the substrate;
    an integrated circuit die electrically connected to a bottom surface of the interposer;
    a spacer structure mechanically connected to the bottom surface of the interposer,
    wherein the spacer structure is disposed beside the integrated circuit die, a first distance between the spacer structure and the substrate is no more than a second distance between the integrated circuit die and the substrate, and
    wherein the first distance is included in a range of approximately 1 micron to approximately 20 microns; and
    a plurality of connection structures electrically connecting the substrate and the interposer.

2. The semiconductor package of claim 1, wherein the spacer structure comprises:
    a support component; and
    a polymer layer.

3. The semiconductor package of claim 2, wherein the polymer layer is between the support component and the bottom surface of the interposer.

4. The semiconductor package of claim 2, wherein the polymer layer is between the support component and the top surface of the substrate.

5. The semiconductor package of claim 1, wherein the spacer structure comprises:
    a metal pillar structure.

6. The semiconductor package of claim 1, wherein the spacer structure comprises:
    a material having a thermal capacitance that is greater relative to a thermal capacitance of a material of the interposer, and wherein the spacer structure is further configured as a heatsink that receives heat from an integrated circuit die attached to the interposer.

7. The semiconductor package of claim 1, wherein the spacer structure comprises:
a position that is aligned to an integrated circuit die attached to a top surface of the interposer,
and wherein the spacer structure is further configured as an electromagnetic shield that shields an electromagnetic field originating from the integrated circuit die.

8. The semiconductor package of claim 1, wherein the spacer structure comprises:
a ceramic capacitor; and
electrodes on opposing sides of the ceramic capacitor.

9. The semiconductor package of claim 1, wherein the top surface comprises:
a recess aligned with an integrated circuit die connected to the bottom surface of the interposer,
wherein an outline of the recess encompasses an outline of the integrated circuit die.

10. The semiconductor package of claim 9, wherein the recess comprises:
a depth,
wherein a ratio of the depth of the recess to a height of the spacer structure is included in a range of up to approximately 1:2.

11. A method, comprising:
forming a spacer structure on a bottom surface of an interposer,
wherein forming the spacer structure comprises forming a bottom surface of the spacer structure at a first distance from the bottom surface of the interposer;
attaching an integrated circuit die to the bottom surface of the interposer,
wherein attaching the integrated circuit die to the bottom surface of the interposer comprises positioning a bottom surface of the integrated circuit die at a second distance from the bottom surface of the interposer, and
wherein the second distance is lesser relative to the first distance; and
attaching a substrate to the bottom surface of the interposer,
wherein attaching the substrate to the bottom surface of the interposer comprises positioning a top surface of the substrate at a third distance from the bottom surface of the interposer, and
wherein the third distance is greater relative to the first distance by a distance of approximately 1 micron to approximately 20 microns.

12. The method of claim 11, wherein forming the spacer structure comprises:
forming a portion of the spacer structure using a photoresist patterning process.

13. The method of claim 11, wherein forming the spacer structure comprises:
forming a portion of the spacer structure using a surface mount process.

14. The method of claim 11, wherein forming the spacer structure comprises:
forming a portion of the spacer structure using a lamination process.

15. The method of claim 11, wherein forming the spacer structure comprises:
forming the spacer structure to comprise a ceramic capacitor; and
forming electrodes on opposing sides of the ceramic capacitor.

16. A semiconductor structure comprising:
an interposer that comprises a bottom surface;
a spacer structure electrically and/or mechanically connected to the bottom surface of the interposer,
wherein the spacer structure comprises a bottom surface at a first distance from the bottom surface of the interposer;
an integrated circuit die electrically and mechanically connected to the bottom surface of the interposer,
wherein the integrated circuit die comprises a bottom surface at a second distance from the bottom surface of the interposer that is lesser relative to the first distance; and
a substrate comprising a top surface that is electrically or mechanically coupled to the bottom surface of the interposer,
wherein the top surface of the substrate and the bottom surface of the spacer structure are separated by a clearance included in a range of approximately 1 micron to approximately 20 microns.

17. The semiconductor structure of claim 16, wherein the spacer structure comprises:
a support component comprising a silicon material or a metal material.

18. The semiconductor structure of claim 17, wherein the spacer structure comprises:
a layer of a material comprising a die-attach film material, a buildup film material, or a polymer material over a surface of the support component.

19. The semiconductor structure of claim 16, wherein the first distance is greater than approximately 120 microns.

20. The semiconductor structure of claim 19, wherein the integrated circuit die comprises:
an edge that is separated a distance from an edge of the spacer structure,
wherein the distance separating the edge of the integrated circuit die from the edge of the spacer structure is greater than approximately 150 microns.

* * * * *